US008866659B2

(12) United States Patent
Stein et al.

(10) Patent No.: US 8,866,659 B2
(45) Date of Patent: Oct. 21, 2014

(54) DATA ACQUISITION DEVICE WITH REAL TIME DIGITAL TRIGGER

(75) Inventors: Anatoli B. Stein, Atherton, CA (US); Igor Tarnikov, Palo Alto, CA (US); Valeriy Serebryanski, Sunnyvale, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 261 days.

(21) Appl. No.: 13/568,605

(22) Filed: Aug. 7, 2012

(65) Prior Publication Data

US 2014/0047198 A1 Feb. 13, 2014

(51) Int. Cl.
*H03M 1/12* (2006.01)

(52) U.S. Cl.
USPC ............... 341/155; 341/156; 341/50; 341/51

(58) Field of Classification Search
CPC ............................... H03M 13/00; G06F 12/00
USPC ........................ 341/155, 156, 50, 51; 711/154
See application file for complete search history.

(56) References Cited

U.S. PATENT DOCUMENTS

| | | | |
|---|---|---|---|
| 5,053,983 A * | 10/1991 | Hyatt | 708/306 |
| 6,584,419 B1 * | 6/2003 | Alexander | 702/68 |
| 6,892,150 B2 | 5/2005 | Pickerd et al. | |
| 7,227,479 B1 * | 6/2007 | Chen et al. | 341/118 |
| 7,233,270 B2 * | 6/2007 | Lin | 341/118 |
| 7,408,495 B2 | 8/2008 | Stein et al. | |
| 7,860,674 B2 | 12/2010 | Freidhof et al. | |

OTHER PUBLICATIONS http://www.scope-of-the-art.com/file_17951/Benefits_of_RTO_digital_trigger_system_2.pdf; "Benefits of the R&S TRO Oscilloscope's Digital Trigger;" Rohde & Schwarz; Guido Scheulze, Markus Freidhof; Apr. 26, 2012; Revision 2.00.

* cited by examiner

*Primary Examiner* — Jean B Jeanglaude
(74) *Attorney, Agent, or Firm* — Burns & Levinson LLP; Joseph M. Maraia

(57) ABSTRACT

A data acquisition device incorporates a front end analog-to-digital converter (ADC), which is responsive to an applied analog input signal, sample that signal and provide digital data representative of the sampled signal. The digital data is applied to a data channel connected to a data acquisition memory, which stores data values representative of the sampled analog input signal. The digital data from the ADC is also applied to a real time a trigger channel connected to a composite function trigger equalizer and filter, a trigger processor and to a trigger memory. The trigger channel operates in real time to identify trigger events and store real-time trigger event occurrence signals in the trigger memory. A controller reads out the stored data values from the data acquisition memory by way of a data equalizer, in synchronism with corresponding real-time trigger event occurrence signals from the trigger memory.

17 Claims, 2 Drawing Sheets

Data acquisition device with time digital trigger

Data acquisition device with time digital trigger

Pre-trigger and post-trigger data storage in the data acquisition memory

DATA ACQUISITION DEVICE WITH REAL TIME DIGITAL TRIGGER

BACKGROUND

Analog trigger techniques are widely used in digital oscilloscopes and data acquisition devices. Analog triggers have well known disadvantages. Often an analog trigger creates trigger jitter as a result of inaccurate analog "trigger interpolation" (time-to-digital conversion), the procedure used to determine the distance between a trigger event and a sampling clock of an analog-to-digital converter (ADC). Another disadvantage of an analog trigger is that it is difficult to implement a sophisticated trigger, such as a pattern trigger or a trigger in the frequency domain.

The above-mentioned problems can be solved by use of a digital trigger technique. The challenge for a digital trigger, is that the digital trigger must work in real time.

In U.S. Pat. No. 6,892,150, a four channel digital oscilloscope is disclosed, including an ADC. In the disclosed oscilloscope, an analog trigger is combined with a digital trigger which is generated in real time by processor unit built on a FPGA for high speed processing. The digital data from the ADC is supplied simultaneously to an acquisition memory and to a digital trigger processor. However, in the disclosed oscilloscope, the digital data from the ADC is not equalized. For this reason, the signal is generally distorted and creates mis-triggers. ADC equalization (for example, equalization of frequency response, group delay equalization) is especially important in high sampling rate ADC's, which typically include multiple time-interleaved ADC's necessary for the high sampling rate In U.S. Pat. No. 7,860,674, a digital triggering system is disclosed for an oscilloscope. In that patent, an equalizer is used after an ADC. The equalized data is distributed to main data channel (for observation on the scope screen) and to a digital trigger processor. As a result, the equalizer works in real time. However, extra filtering is required for the trigger channel, like LPF, HPF, BPF etc., which must be also implemented in real time. The extra resources involved to implement real time equalizer and real time trigger filters are significant and require costs associated with the devices needed to perform the necessary signal processing.

SUMMARY

The invention overcomes the above-mentioned limitations of the prior art and provides benefits particularly in terms of resources needed in a system, to provide high speed, high performance digital oscilloscopes and data acquisition devices incorporating a front end ADC. In various forms, following an ADC, a trigger channel is implemented to be separate from a data channel, wherein the only the trigger channel is required to operate in real time, and still satisfy the critical requirements for sophisticated triggers in such oscilloscopes and data acquisition devices.

In a form, for digital oscilloscopes and data acquisition devices incorporating a front end ADC, digital data from the ADC is split into two paths. The first path is for a main data channel and is connected to a data acquisition memory. The second path is for a trigger channel and is connected to a trigger equalizer and filter.

It is known that high sampling rate ADC's often are arranged as an array of time-interleaved ADC's. For this reason, an equalizer is typically used to perform two functions. The first function reduces the difference between interleaved ADC's in frequency response, group delay response, timing alignment etc. The second function forms a required frequency response and group delay response of the acquisition channel.

The equalizer in the data acquisition channel typically has a wide bandwidth, limited by the system Nyquist requirements. That equalizer is not required to work in real time, so it can be connected after the data has been stored in an acquisition memory. The ability to utilize "not-real-time operation" is possible because generally an equalized signal is used for observation, or measurement, which is typically not performed in real time. Even though real time equalization is not a requirement, in some forms, that equalizer operates in real time.

Different requirements are applied to the trigger equalizer in the trigger channel. First of all, the equalizer of the trigger channel operates in real time. Moreover, in various forms, the frequency response of that equalizer can be adjusted to, for example, cut high frequency to suppress high frequency noise, or provide AC coupling, or cut low frequency to suppress low frequency components. In a preferred form, the equalizer in the trigger channel is a programmable filter adapted to equalize the signal and form user-required phase and frequency response. To save real time processing resources, the programmable equalizer/filter is synthesized and built as a single unit.

Preferably, there is an additional function which is incorporated in the trigger channel. With low oversampling (e.g., 2.5-3 times), it is difficult to identify signal samples below and above a trigger threshold and to precisely (within desired tolerances) identify the times at which signal crosses the trigger threshold. This is especially true with a high threshold level. In various forms, to improve this situation, signal interpolation (pre-interpolation) is implemented in a trigger pre-interpolator. In a form of the pre-interpolator, interpolation coefficients associated with the threshold-crossing decision, are controllable depending on the threshold level. Where a relatively high threshold is required, a relatively high interpolation order is used.

Following the pre-interpolator function, the signal is processed to identify a trigger event. The amplitude, time, and frequency criteria are used separately, or in combination, to identify a trigger event.

In a form, the trigger events are counted and saved in a trigger memory. The acquired data and trigger events are connected to an external memory and processor for post-processing.

In a form, an acquisition system includes an analog-to-digital converter (ADC), a data channel, a real-time trigger channel, a trigger channel controller and write/read address generator.

The ADC is responsive to an applied analog input signal, to generate a digital output signal at a digital output. The digital output signal includes a succession of digital values, where each digital value is representative of a value of the analog input signal at a corresponding succession of sample times.

The data channel is coupled to the digital output signal and includes, in series connection therefrom, a data acquisition memory and a data equalizer. The data acquisition memory is adapted to receive and store the succession of digital values as those values are generated. In some forms, the data equalizer operates in other than real time, and in other forms, the data equalizer operates in real time.

The real-time trigger channel is coupled to the digital output and including in series connection, a composite function trigger equalizer and filter, a pre-interpolator, a trigger processor, a trigger counter and time mark, and a trigger memory.

In a form, the composite function trigger equalizer and filter comprises a digital FIR filter having filter coefficients determined by an applied bandwidth signal and an applied filter-type signal. The composite function trigger equalizer and filter is adapted to process in real time, the succession of digital values in accordance with the filter coefficients and apply the processed values to the pre-interpolator. In a form, coefficients for the FIR filter are determined by multiplying the coefficients of a predetermined digital trigger equalizer and the coefficients of a predetermined digital filter. In a preferred form, the FIR filter is implemented on field programmable gate array (FPGA) device.

The trigger channel controller (i) generates the bandwidth signal and the filter-type signal in response to an applied interface control signal, and (ii) applies the bandwidth signal and filter-type signal to the FIR filter in real time.

The composite function trigger equalizer and filter is adapted to process in real time, the succession of digital values in accordance with the filter coefficients and apply the processed values to the The pre-interpolator and the trigger processor are operative in response to the processed digital values, to identify one or more trigger events.

The trigger counter and time mark is responsive to identified trigger events, to generate and store in the trigger memory, real-time trigger event occurrence signals representative of the occurrence of and corresponding time of occurrence of, the respective identified trigger events.

The write/read address generator selectively reads out the stored data values from the data acquisition memory by way of the data equalizer, in synchronism with the corresponding real-time trigger event occurrence from the trigger memory.

In various forms, a trigger event can have one or more of many forms. For example a trigger event may be characterized (i) as a time at which the analog input signal crosses a predetermined threshold in a first direction, (ii) as a time at which the analog input signal crosses a predetermined threshold in a first direction, and as a further time at which the analog input signal crosses a predetermined threshold in a second direction, wherein the second direction is opposite the first direction, (iii) characterized as a time at which a pulse in the analog input signal has a specified width, (iv) characterized as a time at which a pulse in the analog input signal has a specified width and amplitude, (v) characterized as a time at which a predetermined pattern is detected as occurring in the analog input signal, (vi) characterized as a time at which a predetermined frequency component with a predetermined amplitude and burst width is detected as occurring in the analog input signal, and others.

DETAILED DESCRIPTION OF THE PREFERRED EMBODIMENT

Figure 1:
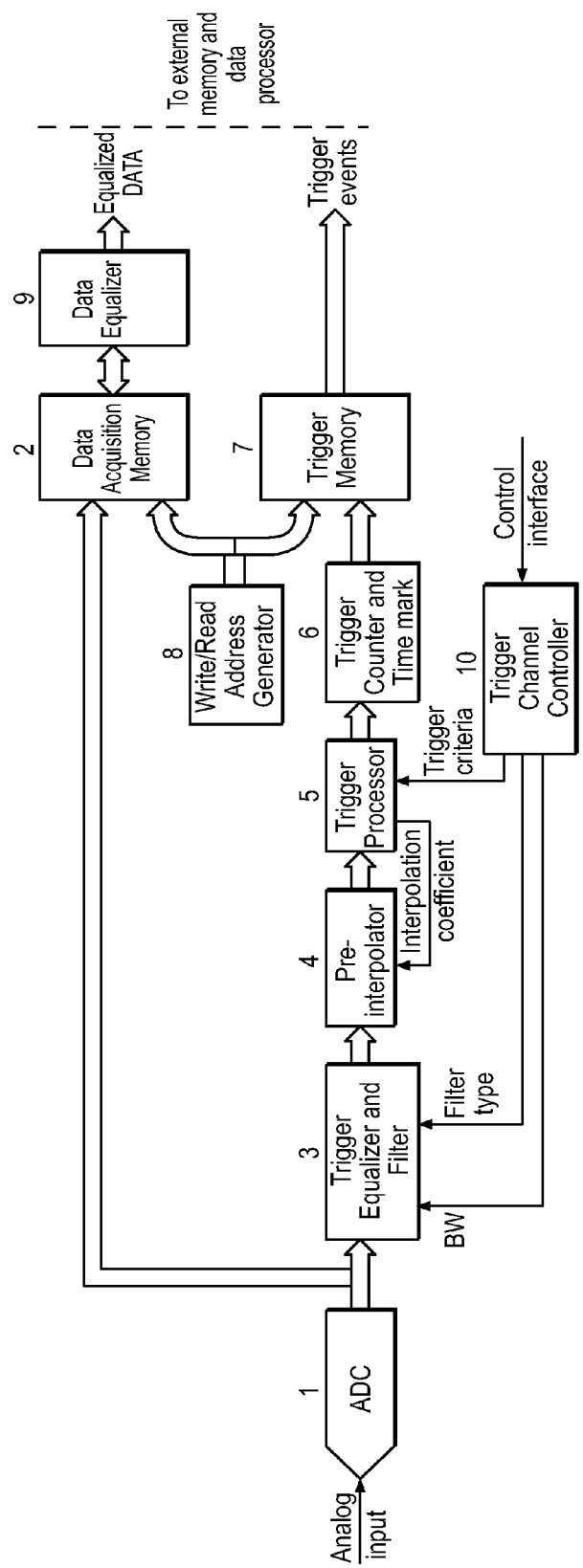
FIG. 1 is a block diagram of an embodiment of the present system.

A block diagram of an exemplary data acquisition device with a real time digital trigger in accordance with the present invention is shown in FIG. 1. An applied analog input signal is digitized by a front end analog-to-digital converter (ADC) 1. From an output of ADC 1, digital data is split and connected to an input of a data acquisition memory 2 and to an input of a composite function trigger equalizer and filter 3. The composite function trigger equalizer and filter 3 is, in a preferred form, a Finite Impulse Response (FIR) filter realized on a field programmable gate array (FPGA) for fast real-time processing.

An exemplary structure for an equalizer for performing the equalizing function of the composite function, is in a preferred form, a Finite Impulse Response (FIR) filter realized on a field programmable gate array (FPGA), for example, as described in U.S. Pat. No. 7,408,495. That '495 patent is hereby incorporated by reference.

An exemplary structure for a filter for performing the filtering function of the composite function, is also a Finite Impulse Response (FIR) filter realized on a field programmable gate array (FPGA). The FIR filter is preferably programmable, and is selectively programmed for different bandwidths (BW Control) and different types of filters (Filter Type Control), for example, low pass filter (LPF), high pass filter (HPF), band pass filter (BPF), with desired predetermined cutoff frequencies.

In a form, the composite function trigger equalizer and filter 3 has a "composite" transfer function which is a result of multiplication of a desired equalizer transfer function and a desired filter transfer function. The composite function trigger equalizer and filter 3 is preferably realized as a single FIR filter with a set of coefficients corresponding to the composite transfer function. The realization of the trigger equalization function and the filter function in a single device, preferably an FIR, provides significant savings and efficiency in real-time processing resources.

The predetermined coefficient settings for the composite function trigger equalizer and filter 3 are controlled by a trigger channel controller 10. The signal at the output of the equalizer and filter 3, is connected to an input of a pre-interpolator 4. The pre-interpolator 4 is characterized by different interpolation coefficients which are programmed by trigger processor 5, which is in turn provided trigger criteria from a trigger channel controller 10 (based on information from a Control Interface).

In a preferred form, the order of interpolation depends on threshold level. For a relatively high threshold level (compared with the input signal amplitude) relatively high oversampling is used, because the probability of sample appearance above of a high threshold is small. Conversely, for a relatively low threshold level, relatively low oversampling is used. To follow the threshold level, the interpolation coefficient control is provided by a trigger processor 5.

The output of pre-interpolator 4 is connected to trigger processor 5, which operates in real time. A trigger event is detected by predefined trigger criteria. A trigger event can be a simple amplitude criterion, where a trigger event is identified as a point in time at which the analog input signal crosses a predetermined threshold. More sophisticated timing/amplitude criteria can alternatively be used. For example, a trigger event may correspond to identification the occurrence of a pulse in the analog input signal having a specified width and/or amplitude (pulse criteria), or when a predetermined pattern in the analog input signal appears in acquired data (pattern criteria). Alternatively, a trigger event may correspond to detection in the in the analog input signal of a specific frequency component with a predetermined amplitude and burst width appears in acquired data (frequency/amplitude/timing criteria). The required frequency response of equalizer and filter is formed by proper filter type control.

In some forms of a trigger processor, extra-interpolation (post interpolation) is used to find a precise trigger position.

The output of trigger processor 5 is connected to a trigger counter and time mark 6. At the trigger counter and time mark 6, each identified trigger event is time-stamped (identified with an occurrence time) and stored in a connected trigger memory 7. The writing to the data acquisition memory 2 and trigger memory 7 is controlled by common write/read address generator 8 such that, during reading out from the respective memories, the position of each trigger event (as stored in trigger memory 7) is synchronized with the corresponding sample value for the acquired data (as stored in data acquisition memory 2).

The acquired data from data acquisition memory 2 is connected to data equalizer 9.

Equalized data is available for application to an external memory and data processor, if required for post-processing, from the output of data equalizer 9. That equalized data is associated with corresponding trigger event data available from an output of the trigger memory 7. As noted above, it is not necessary that the data equalizer 9 operate in real-time.

Figure 2:
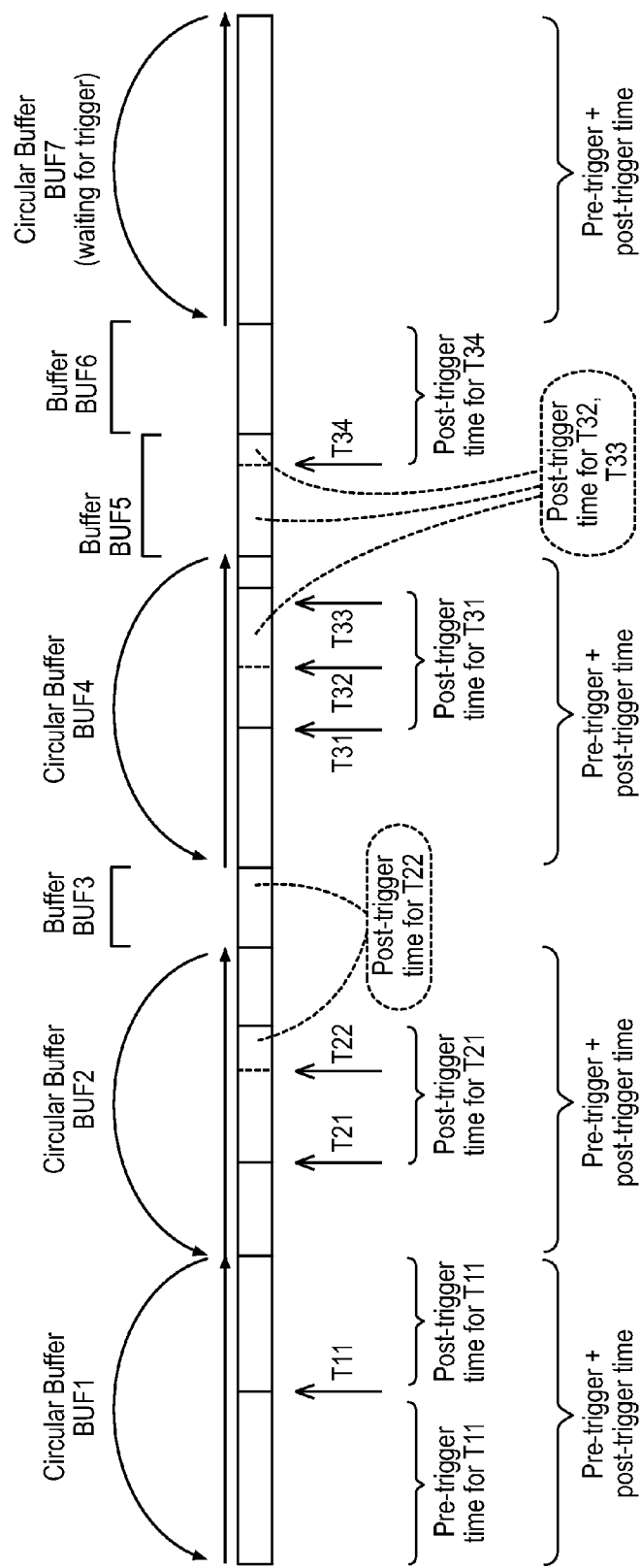
FIG. 2 is a schematic representation of an exemplary form of the pre-trigger and post-trigger data storage in the data acquisition system of FIG. 1.

Generally, it can be important that trigger events, as well as equalized data near in time to the respective trigger events, are stored in memory. It can be important to store data into the memory before trigger event—i.e., at "pre-trigger" times, and after a trigger event—i.e., at "post-trigger" times. For this purpose, in a form, trigger events are stored in the trigger memory 7, and data values are stored in the data acquisition memory 2. Data acquisition memory 2 is used as illustrated in FIG. 2, in the following manner:

1. Continuous memory buffer BUF1 is allocated. BUF-1 is long enough to store pre-trigger and post-trigger data. Data is written into BUF1 in a circular way until a trigger event is received. After first trigger event T11 has occurred, acquisition continues into BUF1 until a specified quantity of post-trigger data has been acquired.
2. After the above step, a new continuous memory buffer BUF2 is allocated. BUF2 is long enough to store pre-trigger and post-trigger data. Data is also written to BUF2 in a circular way. After a second trigger event T21 has occurred, acquisition continues into BUF2 until a specified quantity of the post-trigger data has been acquired.
3. A trigger event T22 occurs during post-trigger acquisition for the trigger event T21. After that a new continuous memory buffer BUF3 is allocated following BUF2. The buffer BUF3 stores the rest of the post-trigger data for the trigger event T22.
4. After the post-trigger data have been accumulated for the trigger event T21, a new circular continuous memory buffer BUF4 is allocated and pre-trigger data for the next trigger even is stored therein. Trigger events T32, T33 have been acquired during post-trigger data acquisition for the trigger event T31. A new continuous memory buffer BUF5 is allocated to store post-trigger data for the trigger event T33.
5. The trigger event T34 occurs during post-trigger data acquisition for the trigger event T33. A new memory buffer BUF6 is allocated to store the post-trigger data for the trigger event T34.
6. After the post-trigger data acquired for trigger event T34, a new circular continuous memory BUF7 is allocated and receives pre-trigger data for a new trigger event.

Write/read address generator 8, shown in FIG. 1, effects the operations described above in connection with FIG. 2. Write/read address generator 8 selectively reads out the stored data values from data acquisition memory 2 by way of data equalizer 9, in synchronism with the corresponding real-time trigger event occurrence signals from trigger memory 7.

Although this invention has been described in terms of certain embodiments, other embodiments that are apparent to those of ordinary skill in the art, including embodiments which do not provide all of the benefits and features set forth herein, are also within the scope of this invention. Accordingly, the scope of the present invention is defined only by reference to the appended claims.

What is claimed is:
1. A data acquisition system, comprising:
a) an analog-to-digital converter (ADC) responsive to an applied analog input signal to generate a digital output signal at a digital output, wherein the digital output signal includes a succession of digital values, and wherein each digital value is representative of a value of the analog input signal and a corresponding succession of sample times;
b) a data channel coupled to the digital output signal and including in series connection therefrom, a data acquisition memory and a data equalizer;
c) a real-time trigger channel coupled to the digital output and including in series connection therefrom,
   i. a composite function trigger equalizer and filter,
   ii. a pre-interpolator,
   iii. a trigger processor,
   iv. a trigger counter and time mark, and
   v. a trigger memory;
d) a trigger channel controller; and
e) a write/read address generator,
   wherein the data acquisition memory is adapted to receive and store the succession of digital values as those values are generated,
   wherein the composite function trigger equalizer and filter comprise a digital FIR filter having filter coefficients determined by an applied bandwidth signal and an applied filter-type signal,
   wherein the trigger channel controller
      i. generates the bandwidth signal and the filter-type signal in response to an applied interface control signal, and
      ii. applies the bandwidth signal and filter-type signal to the FIR filter,
   wherein the composite function trigger equalizer and filter is adapted to process in real time, the succession of digital values in accordance with the filter coefficients and apply the processed values to the pre-interpolator,
   wherein the pre-interpolator and the trigger processor are operative in response to the processed digital values, to identify one or more trigger events,
   wherein the trigger counter and time mark is responsive to identified trigger events, to generate and store in the trigger memory, real-time trigger event occurrence signals representative of the occurrence of and corresponding time of occurrence of, the respective identified trigger events, and
   wherein the write/read address generator selectively reads out the stored data values from the data acquisition memory by way of the data equalizer, in synchronism with the corresponding real-time trigger event occurrence signals from the trigger memory.
2. The data acquisition system according to claim 1 wherein the data equalizer is operative in other than real time.
3. The data acquisition system according to claim 1 wherein the data equalizer is operative in real time.

4. The data acquisition system according to claim 1 wherein a trigger event is characterized as a time at which the analog input signal crosses a predetermined threshold in a first direction.

5. The data acquisition system according to claim 4 wherein a trigger event is characterized as a further time at which the analog input signal crosses a predetermined threshold in a second direction, wherein the second direction is opposite the first direction.

6. The data acquisition system according to claim 1 wherein a trigger event is characterized as a time at which a pulse in the analog input signal has a specified width.

7. The data acquisition system according to claim 1 wherein a trigger event is characterized as a time at which a pulse in the analog input signal has a specified width and amplitude.

8. The data acquisition system according to claim 1 wherein a trigger event is characterized as a time at which a predetermined pattern is detected as occurring in the analog input signal.

9. The data acquisition system according to claim 1 wherein a trigger event is characterized as a time at which a predetermined frequency component with a predetermined amplitude and burst width is detected as occurring in the analog input signal.

10. The data acquisition system according to claim 1, wherein coefficients for the FIR filter are determined by multiplying the coefficients of a predetermined digital trigger equalizer and the coefficients of a predetermined digital filter.

11. The data acquisition system according to claim 2, wherein the FIR filter is implemented on field programmable gate array (FPGA) device.

12. The data acquisition system according to claim 1, wherein the composite function trigger equalizer and filter is characterized by a programmable bandwidth and type of programmable filter.

13. The data acquisition system according to claim 1, wherein the write/read address generator synchronizes the stored data values read out from the data acquisition memory with the corresponding real-time trigger event occurrence read out from the trigger memory.

14. The data acquisition system according to claim 1, wherein the data acquisition memory is controlled whereby pre-trigger and post-trigger data are loaded into the data acquisition memory for any quantity of trigger events occurring at any in arbitrary time.

15. The data acquisition system according to claim 14, wherein the data acquisition memory includes a circular memory buffer allocated to fit pre-trigger and post-trigger data for single trigger event.

16. The data acquisition system according to claim 15, wherein the circular memory buffer is operative whereby, after pre-trigger and post-trigger acquisition is completed, a new circular memory buffer is allocated to store data for a next trigger event.

17. The data acquisition system according to claim 16, wherein the circular memory buffer is operative whereby, if a new trigger event occurs close to a previous trigger event, the new memory buffer is allocated to fit post-trigger data.

* * * * *